(12) United States Patent
Du et al.

(10) Patent No.: US 7,504,338 B2
(45) Date of Patent: Mar. 17, 2009

(54) METHOD OF PATTERN ETCHING A SILICON-CONTAINING HARD MASK

(75) Inventors: Yan Du, Sunnyvale, CA (US); Meihua Shen, Fremont, CA (US); Shashank Deshmukh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 392 days.

(21) Appl. No.: 11/502,163

(22) Filed: Aug. 9, 2006

(65) Prior Publication Data

US 2007/0010099 A1    Jan. 11, 2007

Related U.S. Application Data

(63) Continuation of application No. 10/286,676, filed on Oct. 31, 2002, now abandoned.

(51) Int. Cl.
*H01L 21/311* (2006.01)
*H01L 21/302* (2006.01)

(52) U.S. Cl. .......... 438/694; 438/710; 438/723; 438/724

(58) Field of Classification Search .......... 438/724, 438/723, 710, 694
See application file for complete search history.

(56) References Cited

U.S. PATENT DOCUMENTS

| 4,511,430 | A | 4/1985 | Chen et al. ......... 156/643 |
| 4,671,849 | A | 6/1987 | Chen et al. ......... 438/713 |
| 4,844,773 | A | 7/1989 | Loewenstein et al. ....... 156/643 |
| 5,201,993 | A | 4/1993 | Langley ............ 438/729 |

(Continued)

FOREIGN PATENT DOCUMENTS

DE    4442652 A    1/1996

(Continued)

OTHER PUBLICATIONS

Y. X. Li, et al., "Effects of Plasma Etching Chemistry and Post-Processing on the Mechanical Adhesion and Electrical Contact of Double Polysilicon Layer Structures," IEEE Transactions on Electron Devices, vol. 42, No. 1, (Jan. 1995), pp. 64-69.

(Continued)

*Primary Examiner*—Evan Pert
*Assistant Examiner*—Monica D Harrison
(74) *Attorney, Agent, or Firm*—Shirley L. Church

(57) ABSTRACT

Disclosed herein is a method of pattern etching a layer of a silicon-containing dielectric material. The method employs a plasma source gas including $CF_4$ to $CHF_3$, where the volumetric ratio of $CF_4$ to $CHF_3$ is within the range of about 2:3 to about 3:1; more typically, about 1:1 to about 2:1. Etching is performed at a process chamber pressure within the range of about 4 mTorr to about 60 mTorr. The method provides a selectivity for etching a silicon-containing dielectric layer relative to photoresist of 1.5:1 or better. The method also provides an etch profile sidewall angle ranging from 88° to 92° between said etched silicon-containing dielectric layer and an underlying horizontal layer. in the semiconductor structure. The method provides a smooth sidewall when used in combination with certain photoresists which are sensitive to 193 nm radiation.

33 Claims, 12 Drawing Sheets

U.S. PATENT DOCUMENTS

| | | | |
|---|---|---|---|
| 5,444,013 A | 8/1995 | Akram et al. | 438/398 |
| 5,670,017 A | 9/1997 | Hashimoto | 438/723 |
| 5,702,978 A | 12/1997 | Gabriel et al. | 437/65 |
| 5,814,563 A | 9/1998 | Ding et al. | 438/714 |
| 5,925,575 A | 7/1999 | Tao et al. | 438/692 |
| 5,948,701 A | 9/1999 | Chooi et al. | 438/694 |
| 5,968,844 A | 10/1999 | Keller | 438/695 |
| 5,968,846 A | 10/1999 | Chou et al. | 438/712 |
| 5,976,766 A | 11/1999 | Kasuga et al. | 430/313 |
| 5,994,229 A | 11/1999 | Chen et al. | 438/700 |
| 6,015,760 A | 1/2000 | Becket et al. | 438/714 |
| 6,033,962 A | 3/2000 | Jeng et al. | 438/301 |
| 6,051,504 A | 4/2000 | Armacost et al. | 438/706 |
| 6,083,824 A | 7/2000 | Tsai et al. | 438/629 |
| 6,124,192 A | 9/2000 | Jeng et al. | 438/597 |
| 6,168,992 B1 | 1/2001 | Lee | 438/256 |
| 6,180,515 B1 | 1/2001 | Chuang | 438/637 |
| 6,194,323 B1 | 2/2001 | Downey et al. | 438/717 |
| 6,207,544 B1 | 3/2001 | Nguyen et al. | 438/595 |
| 6,228,727 B1 | 5/2001 | Lim et al. | 438/296 |
| 6,251,764 B1 | 6/2001 | Pradeep et al. | 438/595 |
| 2001/0005636 A1 | 6/2001 | Nishizawa | 438/710 |
| 2002/0139976 A1 | 10/2002 | Hembree et al. | 257/48 |

FOREIGN PATENT DOCUMENTS

| | | |
|---|---|---|
| EP | 0282820 A | 9/1988 |
| EP | 1174911 | 1/2002 |
| GB | 2333268 | 7/1999 |
| JP | 2001093970 A | 4/2001 |

OTHER PUBLICATIONS

Y. X. Li, et al., "Process design for plasma etching of polysilicon/silicon nitride/polysilicon sandwich structures for sensor applications," Microelectronic Engineering 20, (1993), pp. 321-328.

K. Linliu, et al., "Anomalous Junction Leakage Current Induced by Plasma Dry Etch of Shallow Trench Isolation (STI)", 1999 Dry Process Symposium, (1999), pp. 149-154.

Pan, et al., "A New Technology for High-Aspect-Ratio Silicon Etch", Semiconductor Fabtech, Edition 8, May 1997, pp. 209-214.

S. K. Ray, et al., "Rapid plasma etching of silicon, silicon dioxide and silicon nitride using microwave discharges," Semicond. Sci. Technol. 8, (1993), pp. 599-604.

M. Saito, et al., "A Highly Selective Photoresist Ashing Process for Silicon Nitride Films by Addition of Trifluoromethane," Jpn. J. Appl. Phys. vol. 40, Part 1, No. 9A, (Sep. 2001), pp. 5271-5274.

J. H. Ye, et al., "Carbon Rich Plasma-Induced Damage in Silicon Nitride Etch," Journal of the Electrochemical Society, 147 (3), (2000), pp. 1168-1174.

Yan Ye, et al., Proceedings of the Eleventh International Symposium of Plasma Processing, May 7, 1996, as published in the Electrochemical Society Proceedings, vol. 96-12, pp. 222-233 (1996).

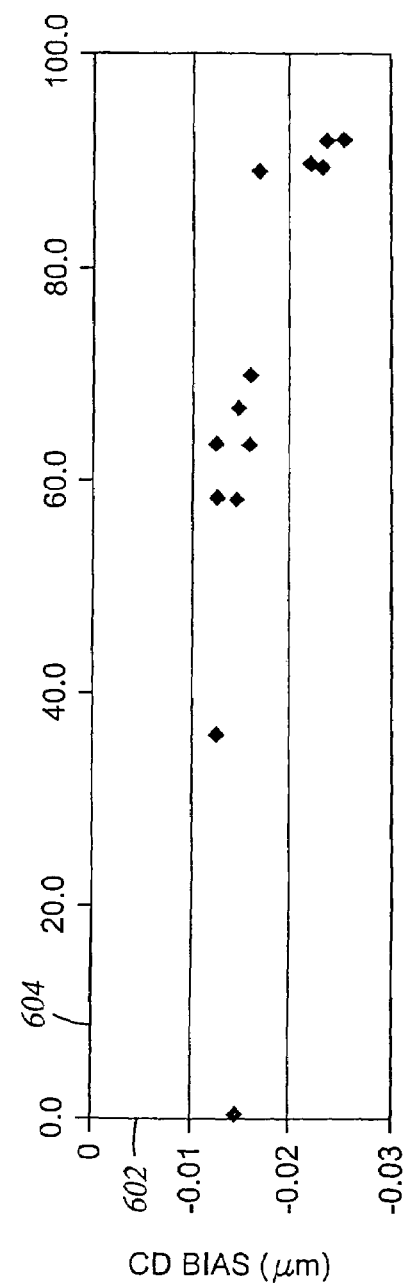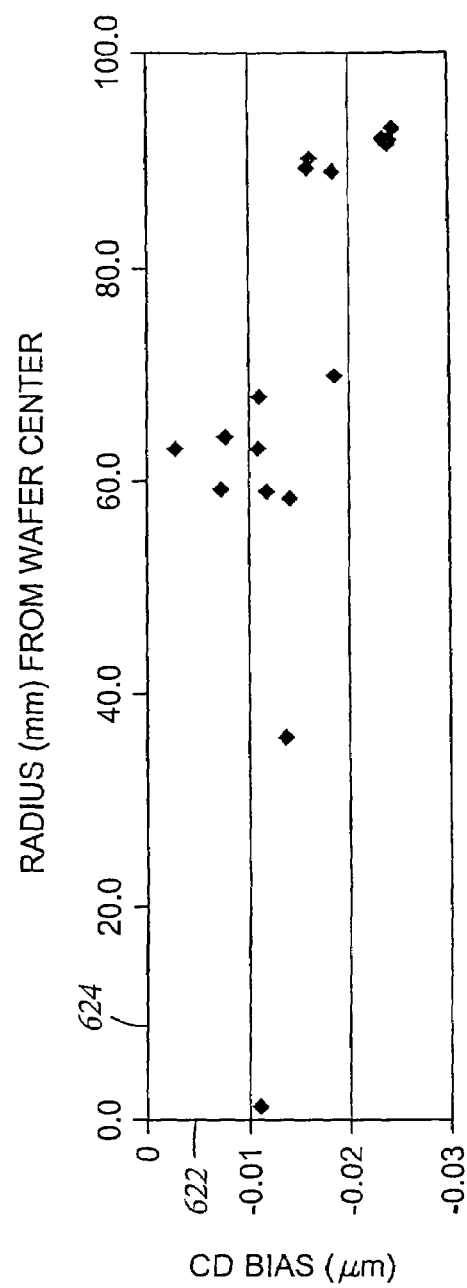
Fig. 6A
Fig. 6B

METHOD OF PATTERN ETCHING A SILICON-CONTAINING HARD MASK

This application is a continuation application of U.S. application Ser. No. 10/286,676 filed Oct. 31, 2002, and entitled: "Method of Etching a Silicon-Containing Dielectric Material".

BACKGROUND OF THE INVENTION

1. Field of the Invention

The present invention pertains to a method of etching a silicon-containing dielectric material. In particular, the invention pertains to a method of pattern etching a layer of a silicon-containing dielectric material for use as a hard mask during subsequent pattern etching of semiconductor device features having a feature size of about 0.15 µm or less.

2. Brief Description of the Background Art

Silicon-containing dielectric materials (such as silicon nitride, silicon oxide, and silicon oxynitride) are often used as hard masks for pattern etching of underlying layers in a semiconductor structure. The silicon-containing dielectric layer itself is typically patterned using an overlying, patterned photoresist. Selectivity for etching the silicon-containing dielectric layer relative to an overlying, organic photoresist is important during the hard mask patterning step. As used herein, the term "selectivity" or "etch selectivity" refers to a ratio of the etch rate of a first material (e.g., a silicon-containing dielectric material) to the etch rate of a second material (e.g., photoresist) using a given plasma source gas and processing conditions.

Conventional plasma etch processes for pattern etching silicon-containing dielectric materials utilize a source gas which is a combination of $CF_4$ and $CH_2F_2$. While this etch chemistry typically provides good (at least 1.5:1) selectivity for etching the silicon-containing dielectric layer relative to the overlying photoresist, the resulting etch profile of a trench into the silicon-containing dielectric layer is typically tapered, as shown in FIG. 2A. Because the silicon-containing dielectric layer will be used as a hard mask for subsequent pattern etching of underlying material layers, it is important that the patterned etch profile of the silicon-containing dielectric layer exhibit an etched line sidewall angle, with respect to a horizontal base, which is as close to 90° as possible (typically ranging between about 88° and 92°). Any deviation from a substantially 90° etch profile will be reflected in the etch profiles of the underlying layers.

SUMMARY OF THE INVENTION

We have discovered a method of pattern etching 0.15 µm size and smaller features into a layer of a silicon-containing dielectric material, while providing good selectivity for etching the silicon-containing dielectric layer relative to an overlying photoresist. The silicon-containing dielectric material is typically silicon nitride, but may alternatively be silicon oxide or silicon oxynitride, for example and not by way of limitation. When etching a pattern of lines and spaces, a particularly smooth etched sidewall profile and good etch profile is obtained when the method is used in combination with a photoresist which is sensitive to 193 nm radiation.

The source gas used for plasma etching the silicon-containing dielectric material includes $CF_4$ in combination with $CHF_3$. Carbon tetrafluoride ($CF_4$) provides an excellent source of fluorine etchant species, while $CHF_3$ provides polymer generation and passivation of exposed photoresist surfaces, extending the lifetime of the photoresist. We have discovered that a volumetric ratio of $CF_4$ to $CHF_3$ in the plasma source gas within the range of about 2:3 to about 3:1 provides both a smooth etched sidewall surface (having a surface roughness of less than 5 nm), a vertical etched line profile (exhibiting an angle ranging from about 88° to about 92°), and good (about 1.5:1 or better) selectivity for etching the silicon-containing dielectric layer relative to an overlying photoresist. Typically, the volumetric ratio of $CF_4$ to $CHF_3$ in the plasma source gas is within the range of about 1:1 to about 2:1.

We have also found that, in order to obtain a vertical etched line profile, as the total gas flow to the etch processing chamber is increased, the volumetric ratio of $CF_4$ to $CHF_3$ in the plasma source gas should be decreased (i.e., the relative amount of $CHF_3$ in the plasma source gas should be increased). By adjusting the total fluorine flow to the chamber during the mask open process, it is possible to tune the CD pattern across the substrate wafer, which makes it possible to compensate for non-uniformities within etch processes subsequently performed on underlying layers within the semiconductor structure across the wafer.

The etch method works particularly well when performed in a semiconductor processing chamber having a decoupled plasma source. The process chamber pressure in such a processing chamber during etching is typically within the range of about 4 mTorr to about 60 mTorr, and more typically within the range of about 20 mTorr to about 60 mTorr.

We have found that the etch method described above works especially well in combination with certain photoresists which are sensitive to 193 nm radiation, of the kind known in the art. The method provides a selectivity for etching a silicon-containing dielectric layer relative to the photoresist of about 1.5:1 or better. The method also provides an etched line profile sidewall angle ranging from 86° to 92° between the etched silicon-containing dielectric layer and an underlying horizontal layer in the semiconductor structure. In addition, the method reduces etched sidewall roughness to about 5 nm or less, which is important for feature sizes less than about 0.10 µm.

BRIEF DESCRIPTION OF THE DRAWINGS

FIG. 6A is a graph 600 showing CD bias 602 as a function of radius 604 of travel from wafer center in dense etched feature areas when a plasma source gas composition of 200 sccm $CF_4$ and 130 sccm $CHF_3$ was used to pattern etch a silicon nitride layer. The process chamber pressure was 45 mTorr.

FIG. 6B is a graph 620 showing CD bias 622 as a function of radius 624 of travel from wafer center in isolated etched feature areas when a plasma source gas composition of 200 sccm $CF_4$ and 130 sccm $CHF_3$ was used to pattern etch a silicon nitride layer. The process chamber pressure was 45 mTorr.

DETAILED DESCRIPTION OF EXEMPLARY EMBODIMENTS

Disclosed herein is a method of pattern etching a layer of a silicon-containing dielectric material. The method is particularly useful when pattern etching a silicon-containing dielectric layer using a photoresist which is sensitive to 193 nm radiation, where the patterned silicon-containing dielectric layer is to be subsequently used as a hard mask for pattern etching of semiconductor device features having a feature size of about 0.15 μm or less; more typically, about 0.1 μm or less.

Exemplary processing conditions for performing various embodiments of the method of the invention are set forth below. Although the method embodiments described below pertain to the use of a silicon-containing dielectric material as a hard mask in the etching of a gate structure, the etch chemistry and processing conditions described below can be used any time a silicon-containing dielectric material is used as a masking layer, for example, in the etching of a trench or other semiconductor feature.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment etch methods described herein are typically performed in a plasma etch chamber having a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96-12, pp. 222-233 (1996). In particular, the embodiment example etch processes described herein were carried out in a CENTURA® DPS II™ plasma etch chamber available from Applied Materials, Inc., of Santa Clara, Calif. This apparatus used to carry out the etching described herein is discussed in detail below; however, it is contemplated that other apparatus known in the industry may be used to carry out the invention.

Figure 4A:
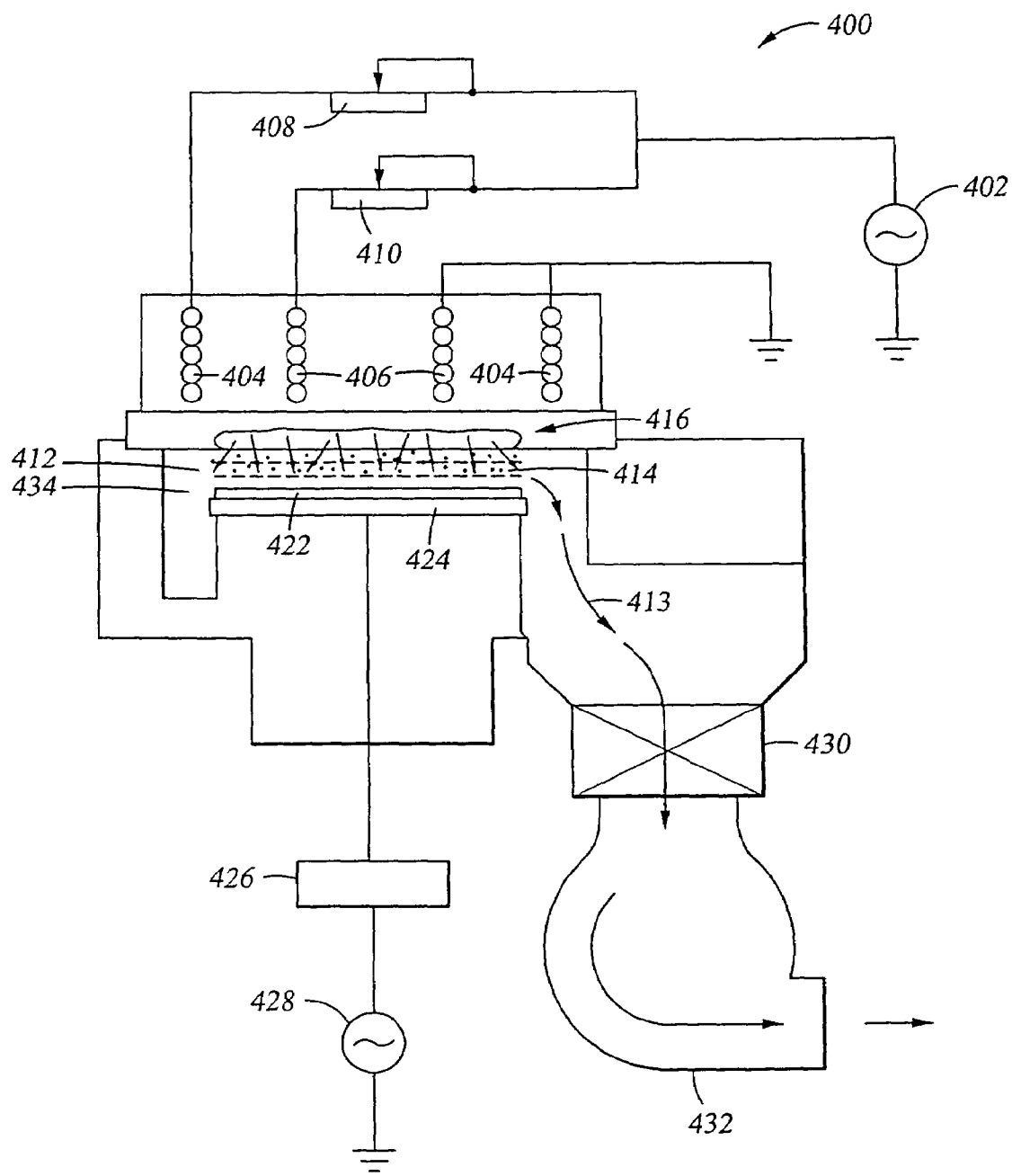
FIG. 4A is a schematic of a CENTURA® DPS II™ (Model of Apparatus) etch chamber of the kind which was used in processing the example embodiments described herein.

FIG. 4A shows a schematic of a cross-sectional view of a CENTURA® DPS II™ plasma etch chamber 400 of the kind which was used to carry out the etching processes described herein. During processing, a substrate 422 is introduced into the chamber 400 through a slit valve 434. The substrate 422 is held in place by means of a static charge generated on the surface of an electrostatic chuck (ESC) cathode 424, by applying a DC voltage to a conductive layer located under a dielectric film on the chuck surface (not shown). Etch gases are introduced into the chamber 400 by means of a gas distribution assembly 416. The etch chamber 400 uses an inductively coupled plasma RF source power 402, which is connected to an outer inductive coil 404 and an inner inductive coil 406 for generating and sustaining a high density plasma 414 in plasma processing region 412. Plasma source power 402 is split off into a first power distribution system 408, which provides power to outer coil 404, and a second power distribution system 410, which provides power to inner coil 406. The substrate 422 is biased by means of an RF source 428 and matching network 426. Power to the plasma source 402 and substrate biasing means 428 are controlled by separate controllers (not shown). Etch byproducts and excess processing gases 413 are exhausted from the chamber through throttle valve 430, by means of pump 432, which maintains the desired process chamber pressure. The temperature of the semiconductor substrate 422 is controlled using the temperature of the electrostatic chuck cathode 424 upon which the substrate 422 rests. Typically, a helium gas flow is used to facilitate heat transfer between the substrate and the pedestal.

Although the etch process chamber used to process the substrates described in the Examples presented herein is shown in schematic in FIG. 4A, one skilled in the art may use any of the etch processors available in the industry, with some readily apparent adjustments in process conditions other than the plasma source gas compositions described herein. For example, the method of the invention may alternatively be performed in an etch processing apparatus wherein power to a plasma generation source and power to a substrate biasing means are supplied by a single power supply, such as the Applied Materials' MXP or MXP+ polysilicon etch chamber.

Figure 4B:
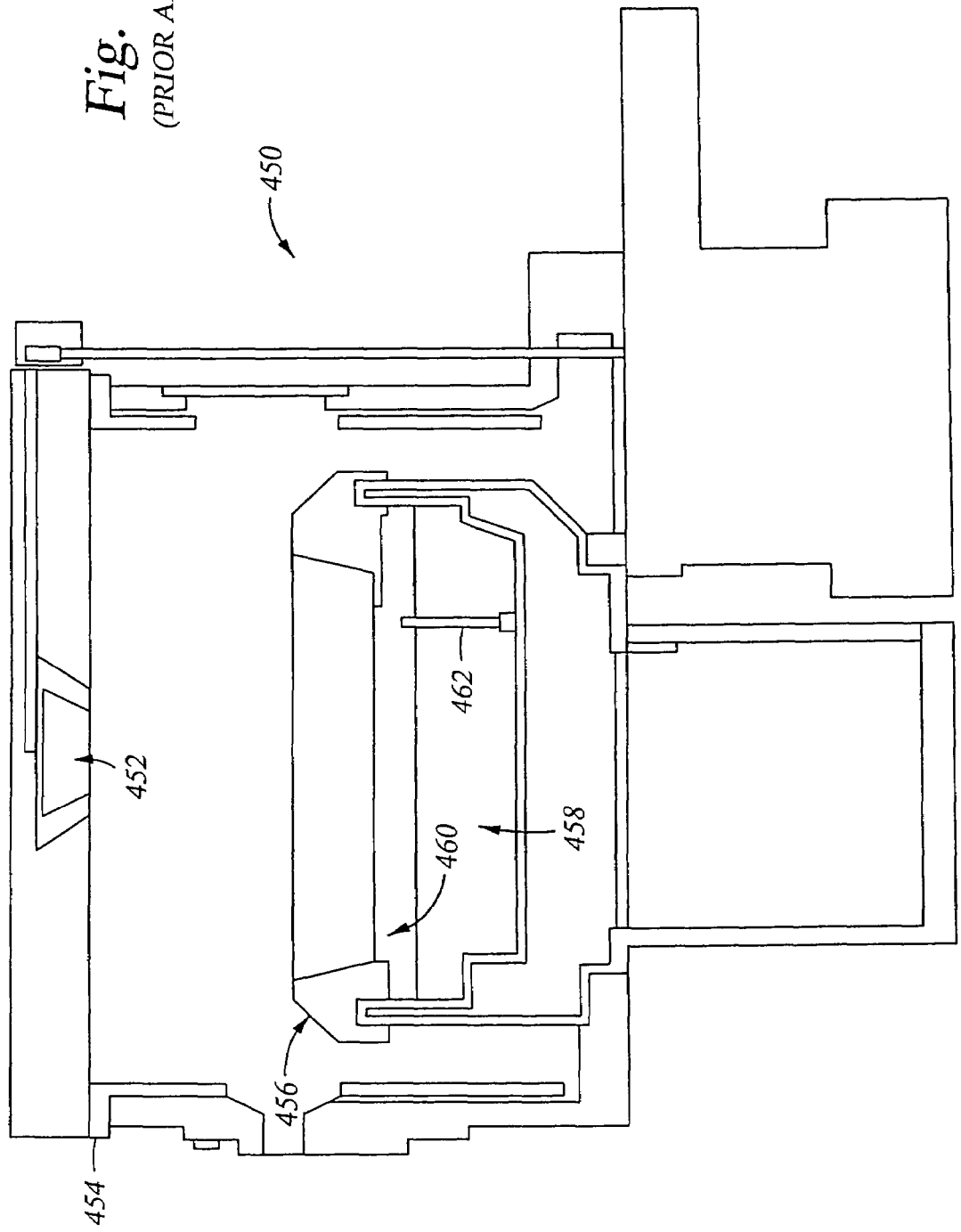
FIG. 4B is a schematic of an Applied Materials' MXP+ polysilicon etch chamber, which is an alternative example of an apparatus of the kind which can be used to carry out the etching processes described herein, when various process conditions are adjusted.

FIG. 4B is a schematic of an Applied Materials' MXP+ polysilicon etch chamber 450, which is a parallel plate plasma etch chamber of the kind which is known in the art. The MXP+ polysilicon etch chamber includes a simplified, two-dimensional gas distribution plate 452, which allows for more uniform gas distribution throughout the chamber. The focus ring 456 moves together with (rather than independently from) the cathode 458, resulting in reduced particle generation due to fewer moving parts within the apparatus. The high temperature cathode 458 has independent temperature control (not shown), which functions in response to a temperature reading from pedestal temperature probe 462, which permits operation at a temperature in excess of the process chamber temperature. The substrate to be processed (not shown) rests on an electrostatic chuck pedestal 460, which is joined to cathode 458.

Figure 1A:
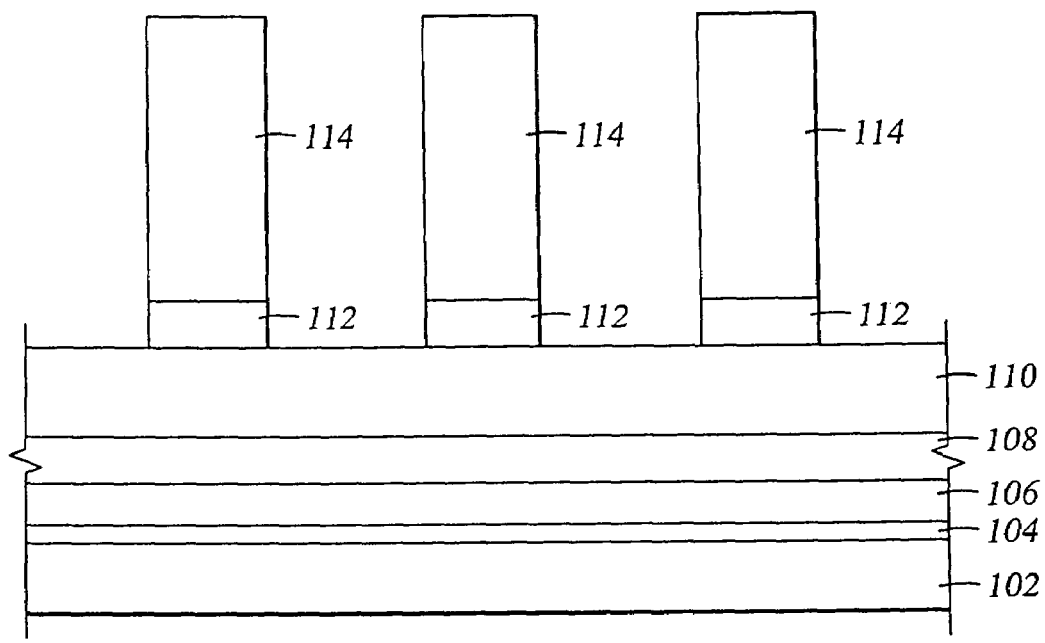
FIG. 1A shows a typical starting structure 100 which was used in the example embodiments described herein. Structure 100 included the following layers, from top to bottom: a patterned photoresist layer 114 which is sensitive to 193 nm radiation; a patterned organic bottom anti-reflective coating (BARC) layer 112; a silicon nitride layer 110; a tungsten layer 108; a polysilicon layer 106; and a gate oxide layer 104, all deposited overlying a single-crystal silicon substrate 102.

II. Exemplary Methods of Pattern Etching a Silicon-Containing Dielectric Layer FIG. 1A shows a typical starting structure 100 for performing the embodiment etching methods described herein. Structure 100 includes the following layers, from top to bottom: a patterned 193 nm photoresist layer 114; a patterned bottom anti-reflective coating (BARC) layer 112; a silicon-containing dielectric layer 110; a tungsten layer 108; a polysilicon layer 106; and a gate oxide layer 104, all overlying a single-crystal silicon substrate 102.

The various layers in semiconductor structure 100 were deposited using conventional deposition techniques known in the art, as follows.

Gate oxide layer 104 is generally a silicon oxide layer, which was formed by thermal oxidation, according to techniques known in the art. Gate oxide layer 104 had a thickness within the range of about 15 Å to 50 Å.

Polysilicon layer 106 was deposited by chemical vapor deposition (CVD), according to techniques known in the art. Polysilicon layer 106 had a thickness within the range of about 500 Å to about 2000 Å.

Tungsten layer 108 was deposited by CVD, according to techniques known in the art. Tungsten layer 108 had a thickness within the range of about 300 Å to about 1000 Å.

In the Examples described below, silicon-containing dielectric layer 110 was silicon nitride. However, silicon-containing dielectric layer 110 may alternatively comprise silicon oxide or silicon oxynitride. Optionally, silicon-containing dielectric layer 110 may be a dual layer, with an upper layer of silicon oxide and a lower layer of silicon nitride, by way of example and not by way of limitation.

Silicon nitride layer 110 was deposited by low pressure CVD (LPCVD) or plasma-enhanced CVD (PECVD), according to techniques known in the art. Silicon nitride layer 110 had a thickness within the range of about 1000 Å to about 2500 Å.

Antireflective coatings are used in combination with photoresists to reduce standing waves and back-scattered light, so that the imaging within the photoresist can be better controlled. When the ARC layer lies beneath the photoresist layer, it is commonly referred to as a bottom antireflective coating (BARC). In the present instance, organic BARC layer 112 was deposited by spin-on techniques known in the art. Organic BARC layer 112 had a thickness within the range of about 500 Å to about 1500 Å.

Photoresist layer 114 was a photoresist which is sensitive to radiation within the range of about 100 nm to about 200 nm. Typically, the photoresist is a chemically amplified organic, polymeric-based composition which is available from a number of manufacturers, including JSR Corporation (Tokyo, Japan); AZ Electronic Materials (Somerville, N.J.); and Shipley, Inc. (Marlboro, Mass.). A typical film thickness for such a photoresist ranges from about 2000 Å to about 3000 Å. The thickness and patterning method for the photoresist layer 114 will depend on the particular photoresist material used and the pattern to be etched in the underlying substrate. In the present instance, for etching a pattern of lines and spaces which are less than 150 nm wide through a 2000 Å thick layer of silicon nitride, the resist thickness was about 3000 Å. The maximum thickness of the photoresist is limited by the aspect ratio of the photoresist being developed and the characteristics of the photoresist used. To obtain advantageous results, the aspect ratio of the photoresist being developed is typically about 4:1 or less; more typically, about 3:1 or less.

Patterned photoresist layer 114 was used as a mask to transfer the pattern to underlying BARC layer 112. Pattern etching of lines and spaces through BARC layer 112 was performed using a plasma source gas including $CF_4$ and argon. Typical process conditions for pattern etching of organic BARC layer 112 were as follows: 100 sccm of $CF_4$; 100 sccm of Ar; 4 mTorr to 20 mTorr process chamber pressure; 300 W to 1000 W plasma source power; 30 W to 100 W substrate bias power (about −60 V to −1000 V substrate bias voltage); and a 40° C. to 80° C. substrate temperature. Etching time will depend on the composition and thickness of the particular organic BARC layer being etched. For a BARC layer having a thickness of about 800 Å, the etch time is typically within the range of about 20 seconds to about 30 seconds.

III. Comparative Silicon Nitride Etch Examples

Commonly owned, copending U.S. application Ser. No. 10/286,297 ("the '297 application"), filed on the same day as the present application, also discloses a method of pattern etching feature sizes ranging from about 0.13 μm to about 0.25 μm into a layer of a silicon-containing dielectric material. The etching method involves using a plasma generated from a plasma source gas comprising about 30 to about 70 volume % $CH_2F_2$, about 30 to about 70 volume % $CF_4$, and about 2 to about 20 volume % $O_2$. The plasma source gas may be diluted with an inert gas such as helium, argon, neon, xenon, or krypton, by way of example and not by way of limitation. Often, the nonreactive diluent gas is helium. Often, the plasma source gas is selected to include about 10 to about 25 volume % $CH_2F_2$, about 10 to about 25 volume % $CF_4$, about 2 to about 10 volume % $O_2$, and about 50 to about 70 volume % helium. The method is typically performed in a semiconductor processing chamber having a decoupled plasma source. The process chamber pressure during etching is typically within the range of about 4 mTorr to about 10 mTorr. When used in combination with a photoresist which is sensitive to 248 nm radiation, the method provides both good (about 2:1 or better) selectivity for etching a silicon-containing dielectric material relative to photoresist and excellent etch profile control. The method provides a line etch profile sidewall angle ranging from 80° to 89° between the etched silicon-containing dielectric layer and an underlying horizontal layer in the semiconductor structure, while providing an etched sidewall surface roughness of about 5 nm or less.

However, as semiconductor device feature sizes decrease below about 0.13 μm, it becomes necessary to use a photoresist that can be imaged at wavelengths of light less than about 200 nm. Popular photoresists which are imagable by 193 nm radiation are available from a number of manufacturers, including JSR Corporation (Tokyo, Japan); AZ Electronic Materials (Somerville, N.J.); and Shipley, Inc. (Marlboro, Mass.).

When we tried to use the $CH_2F_2/CF_4/O_2$ etch chemistry disclosed in the '297 application (AM-6867) in combination with a photoresist for sub-150 nm devices which is based on alicyclic polymer resin technology to pattern etch a 0.13 μm lines and spaces pattern in a silicon nitride layer, the result was a hard mask opening having either significant sidewall striations, a tapered profile, or both, as described in the following comparative examples.

The following comparative examples were performed using the starting structure 100 shown in FIG. 1. Thicknesses of the various layers were as follows: a 3000 Å thick patterned 193 nm photoresist layer 114 (JSR Corporation, Tokyo, Japan); a 800 Å thick patterned organic BARC layer 112; a 2000 Å thick silicon nitride layer 110; a 500 Å thick tungsten layer 108; a 800 Å thick polysilicon layer 106; and a 15 Å thick silicon oxide gate layer, all deposited overlying a single-crystal silicon substrate 102.

After patterning of organic BARC layer 112, silicon nitride layer 110 was etched. Silicon nitride etching was performed in an Applied Materials' DPS II plasma etch chamber (of the kind shown in FIG. 4). Plasma etching of silicon nitride layer 110 was performed using the following plasma source gas composition and etch process conditions: 30 sccm $CF_4$; 60 sccm $CH_2F_2$; 5 sccm $O_2$; 4 mTorr process chamber pressure; 1200 W plasma source power; 250 W substrate bias power; and 60° C. substrate temperature.

Figure 1B:
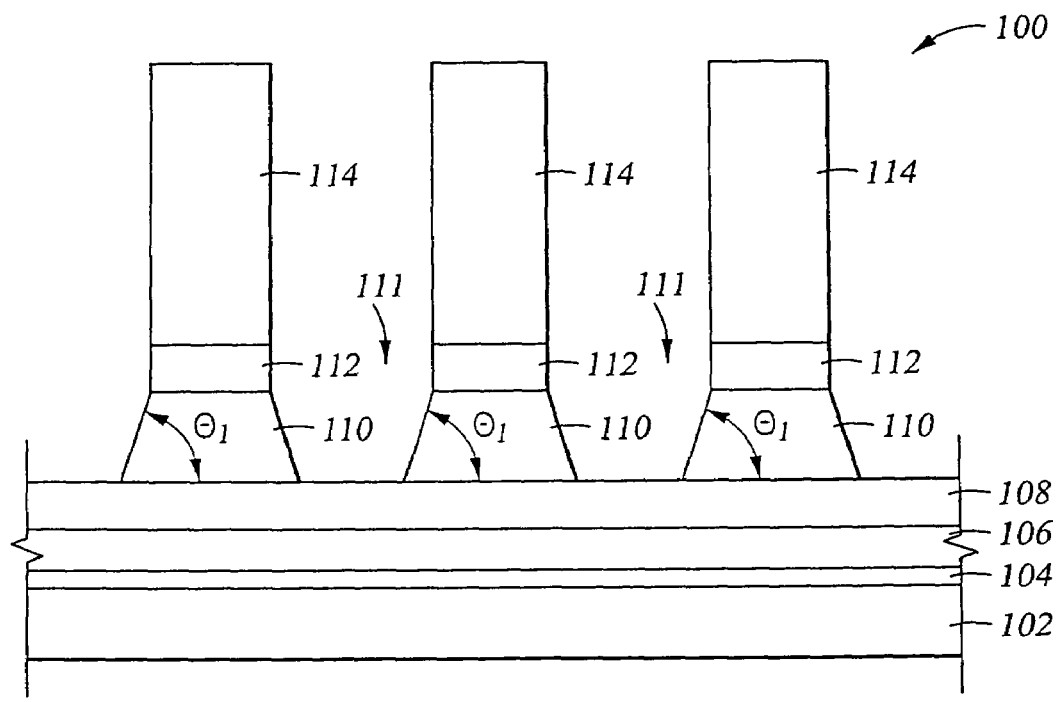
FIG. 1B shows a schematic cross-sectional front view of structure 100 after pattern etching of silicon nitride layer 110, when a previously known, comparative method is used to etch the silicon nitride layer 110.

FIG. 1B shows a schematic front view of structure 100 after pattern etching of silicon nitride layer 110, when etching was performed using the $CF_4/CH_2F_2/O_2$ etch chemistry and process conditions set forth above. Note the profile of etched silicon nitride layer 110, where the trenches 111 etched into silicon nitride layer 110 have a tapered profile.

Figure 2A:
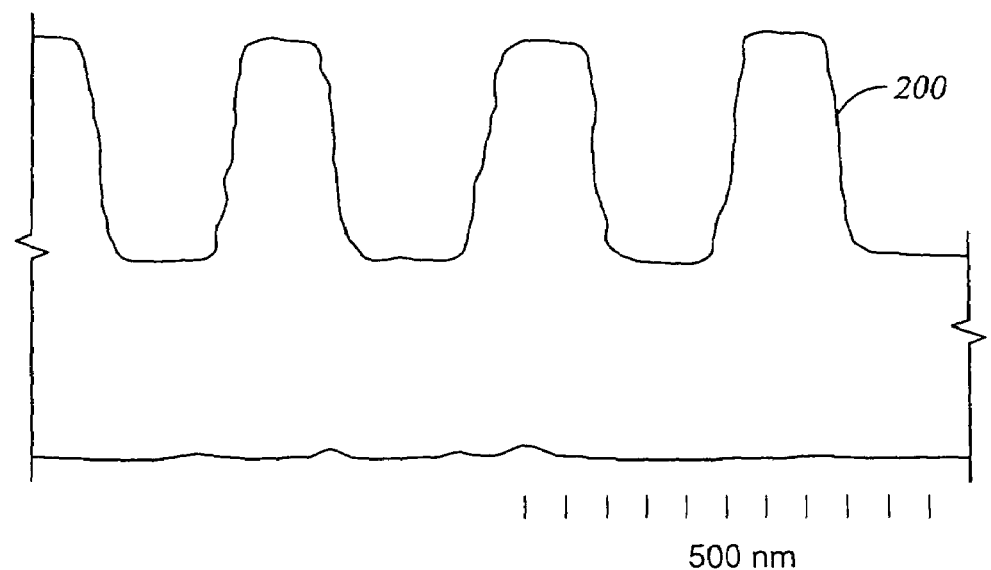
FIG. 2A shows a schematic cross-sectional front view of a silicon nitride layer 200, etched in a lines and spaces pattern, where the etched trench exhibits a tapered profile, where the trench is wider at the top and narrower at the bottom.
Figure 2B:
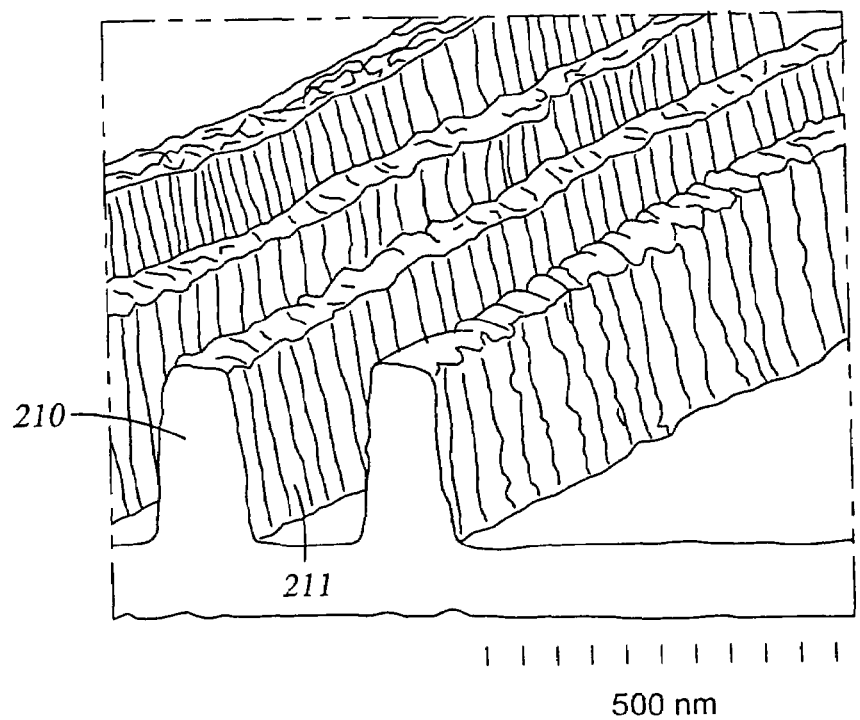
FIG. 2B shows a schematic side view of the etched silicon nitride layer 200 of FIG. 2A, which was traced from a photomicrograph.
Figure 2C:
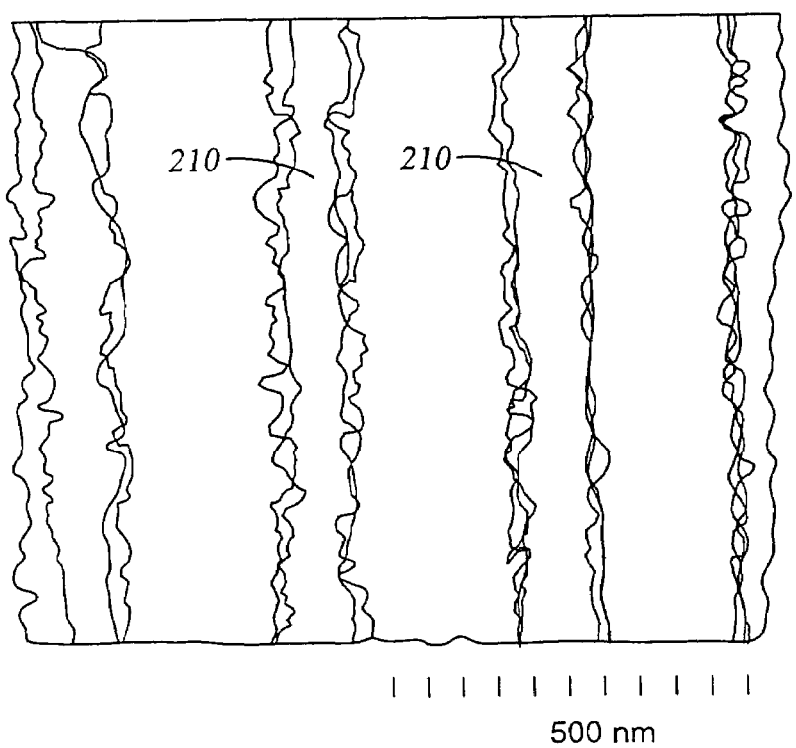
FIG. 2C shows a schematic top view of the etched silicon nitride layer 200 of FIG. 2A, which was traced from a photomicrograph.

FIGS. 2A-2C are schematic drawings traced from photomicrographs taken of a silicon nitride layer 200, etched in a 0.20 μm lines and spaces pattern, where etching was performed using the $CF_4/CH_2F_2/O_2$ etch chemistry described in the '297 application, in combination with an alicyclic-based photoresist sensitive to 193 nm radiation. FIG. 2A shows a schematic cross-sectional front view of silicon nitride layer 200, when etching was performed using a plasma source gas composition consisting of approximately 32 volume % $CF_4$, 63 volume % $CH_2F_2$, and 5 volume % $O_2$ etch chemistry. The etched trench 211 exhibits a substantially tapered profile.

The '297 application teaches the addition of $O_2$ to the plasma source gas for the purpose of profile control. Therefore, in hopes of obtaining a more vertical etch profile for line 210, we performed an experiment in which we increased the amount of $O_2$ in the plasma source gas to 14 volume % (the relative proportions of $CF_4$ and $CH_2F_2$ in the source gas remained the same). Plasma etching of the silicon nitride layer was performed using the following plasma source gas composition and etch process conditions: 30 sccm $CF_4$; 60 sccm $CH_2F_2$; 15 sccm $O_2$; 4 mTorr process chamber pressure; 1000 W plasma source power; 250 W substrate bias power; and 60° C. substrate temperature.

The resulting etch profile was more vertical than that shown in FIG. 2A. However, the etched sidewall exhibited severe striation and was particularly rough (exhibiting a surface roughness of about 15 nm). FIG. 2B shows a schematic side view of the etched silicon nitride layer 210 showing the striations. FIG. 2C shows a schematic top view of the etched silicon nitride layer 210 of FIG. 2B. The etched line exhibits a very non-uniform line width due to the sidewall striations.

Because the silicon-containing dielectric layer will be used as a hard mask for subsequent pattern etching of underlying material layers, it is important that the masking layer sidewall surfaces be as smooth as possible, and that the patterned etch profile of the silicon-containing dielectric layer exhibit a sidewall angle, with respect to a horizontal base, which is as close to 90° as possible. Any non-uniformity and/or tapering in the etch profile of the mask opening will be reflected in the etch profiles of the underlying layers.

Therefore, we needed to a develop a method of pattern etching a layer of a silicon-containing dielectric material which provides a smooth etched feature sidewall and a vertical etch profile when used in combination with certain 193 nm photoresists, such as those which are based on alicyclic polymer resin technology IV. Invention Embodiment Examples We have discovered a method of pattern etching a layer of a silicon-containing dielectric material which provides good selectivity for etching the silicon-containing dielectric layer relative to photoresist, a smooth etch profile, and good etch profile control, when used in combination with certain 193 nm photoresists. The source gas used for plasma etching the silicon-containing dielectric material includes $CF_4$ in combination with $CHF_3$.

The following examples were performed using the starting structure 100 shown in FIG. 1. Thicknesses of the various layers were as follows: a 3000 Å thick patterned 193 nm photoresist layer 114 (JSR Corporation, Tokyo, Japan); a 800 Å thick patterned BARC layer 112; a 2000 Å thick silicon nitride layer 110; a 500 Å thick tungsten layer 108; a 800 Å thick polysilicon layer 106; and a 15 Å thick silicon oxide gate layer, all deposited overlying a single-crystal silicon substrate 102.

After patterning of BARC layer 112, silicon nitride layer 110 was etched. Silicon nitride etching was performed in an Applied Materials' DPS II plasma etch chamber (shown in FIG. 4). Silicon nitride etch process conditions used during each experiment are presented in Tables One and Two, below.

TABLE ONE

Process Conditions Used During Etching of Silicon Nitride

| Process Parameter | Run #1 | Run #2 | Run #3 | Run #4 | Run #5 |
|---|---|---|---|---|---|
| $CF_4$ Flow Rate (sccm) | 100 | 200 | 200 | 200 | 200 |
| $CHF_3$ Flow Rate (sccm) | 100 | 65 | 65 | 85 | 85 |
| Process Chamber Pressure (mTorr) | 15 | 30 | 45 | 15 | 30 |
| RF Power to Inner Coil (W) | 250 | 250 | 250 | 250 | 250 |
| RF Power to Outer Coil (W) | 250 | 250 | 250 | 250 | 250 |
| Total Plasma Source Power (W) | 500 | 500 | 500 | 500 | 500 |
| Substrate Bias Power (W) | 100 | 100 | 100 | 100 | 100 |
| Substrate Temperature (° C.) | 60 | 60 | 60 | 60 | 60 |
| Etch Time Period (seconds) | 49 | 54 | 69 | 58 | 64 |
| $Si_xN_y$: PR Selectivity | 1.8 | 1.2 | 1.5 | 1.1 | 1.5 |
| Etch Profile Angle ($\theta$) | 86 | 93 | 94 | 88 | 92 |

TABLE TWO

Process Conditions Used During Etching of Silicon Nitride

| Process Parameter | Run #6 | Run #7 | Run #8 | Run #9 | Run #10 |
|---|---|---|---|---|---|
| $CF_4$ Flow Rate (sccm) | 200 | 200 | 200 | 200 | 200 |
| $CHF_3$ Flow Rate (sccm) | 85 | 110 | 110 | 40 | 80 |
| Process Chamber Pressure (mTorr) | 45 | 15 | 30 | 45 | 30 |
| RF Power to Inner Coil (W) | 250 | 250 | 250 | 250 | 250 |
| RF Power to Outer Coil (W) | 250 | 250 | 250 | 250 | 250 |
| Total Plasma Source Power (W) | 500 | 500 | 500 | 500 | 500 |
| Substrate Bias Power (W) | 100 | 100 | 100 | 100 | 100 |
| Substrate Temperature (° C.) | 60 | 60 | 60 | 60 | 60 |
| Etch Time Period (seconds) | 75 | 60 | 70 | 61 | 71 |
| $Si_xN_y$: PR Selectivity | 1.5 | 1.1 | 1.5 | 1.3 | 1.4 |
| Etch Profile Angle ($\theta$) | 93 | 86 | 89 | 97 | 95 |

Figure 1C:
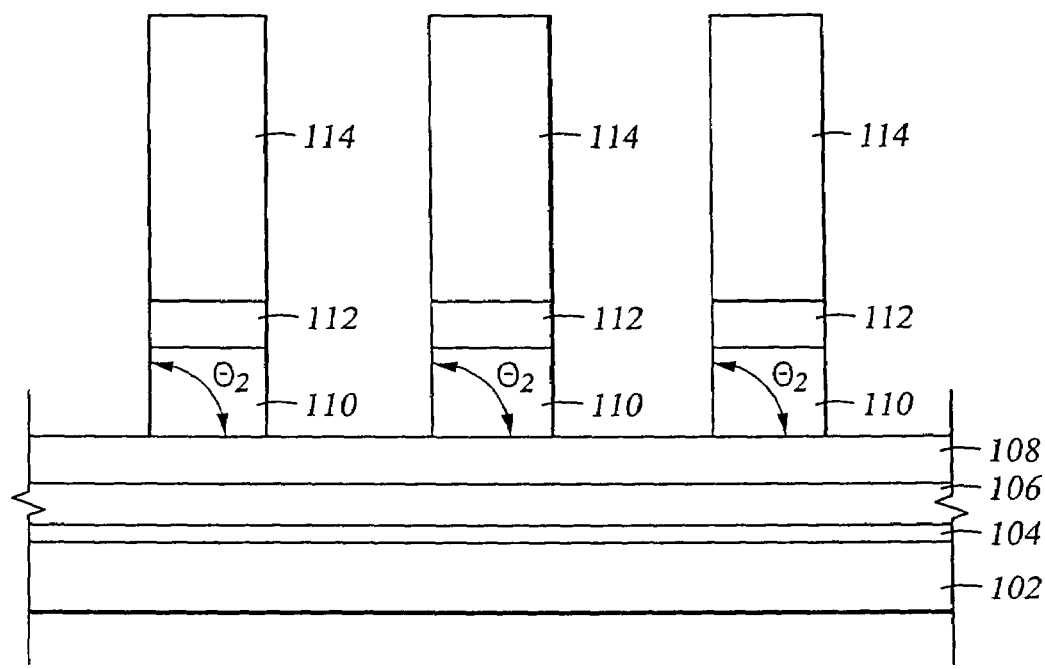
FIG. 1C shows a schematic front view of structure 100 after pattern etching of silicon nitride layer 110 using an embodiment method of the invention.

FIG. 1C shows structure 100 after pattern etching of silicon nitride layer 110. As shown in FIG. 1C, etched silicon nitride layer 110 has a substantially vertical line profile, as indicated by $\theta_2$.

Figure 3A:
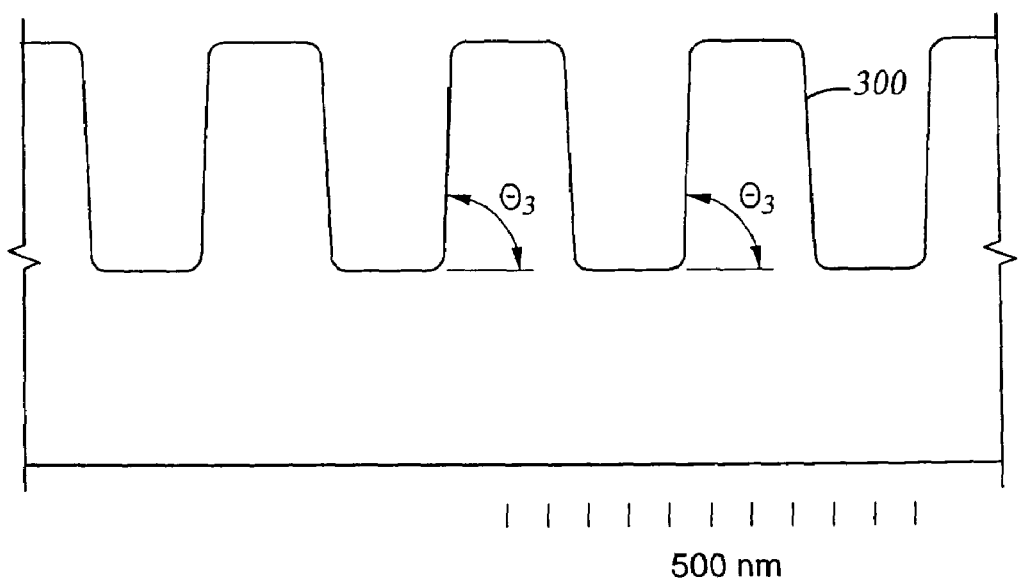
FIG. 3A shows a schematic cross-sectional front view of silicon nitride layer 300 etched in a lines and spaces pattern using an embodiment method of the invention, where the etched line exhibits a vertical sidewall profile, where the angle $\theta_3$ between the sidewall and a horizontal surface at the base of the sidewall ranges between about 86° and about 92°.
Figure 3B:
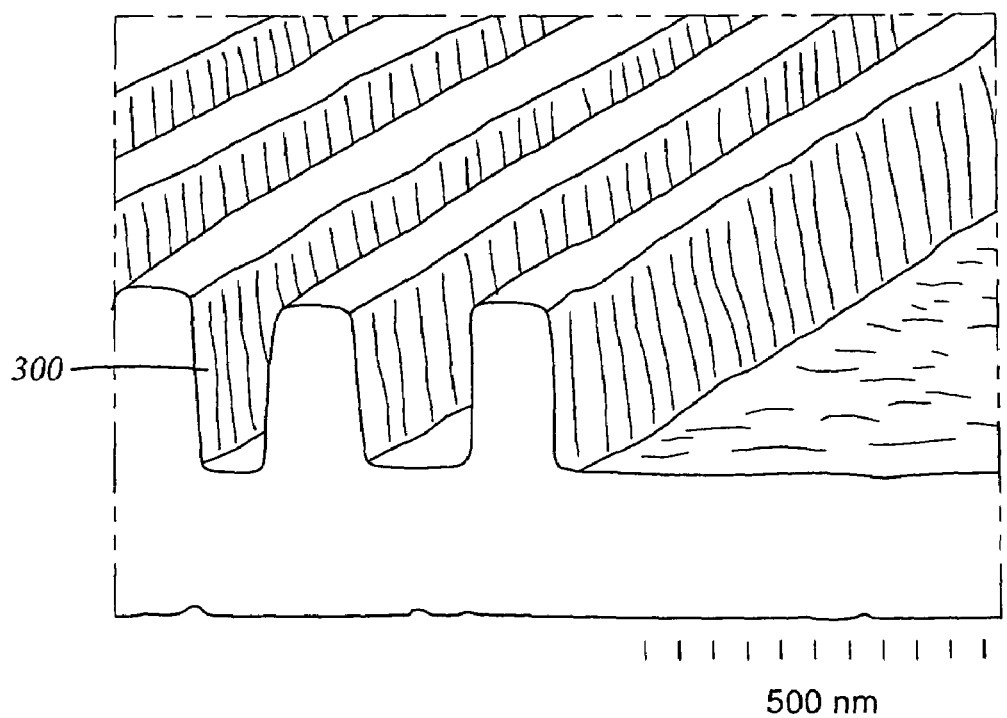
FIG. 3B shows a schematic side view of the etched silicon nitride layer 300 of FIG. 3A, which was traced from a photomicrograph.
Figure 3C:
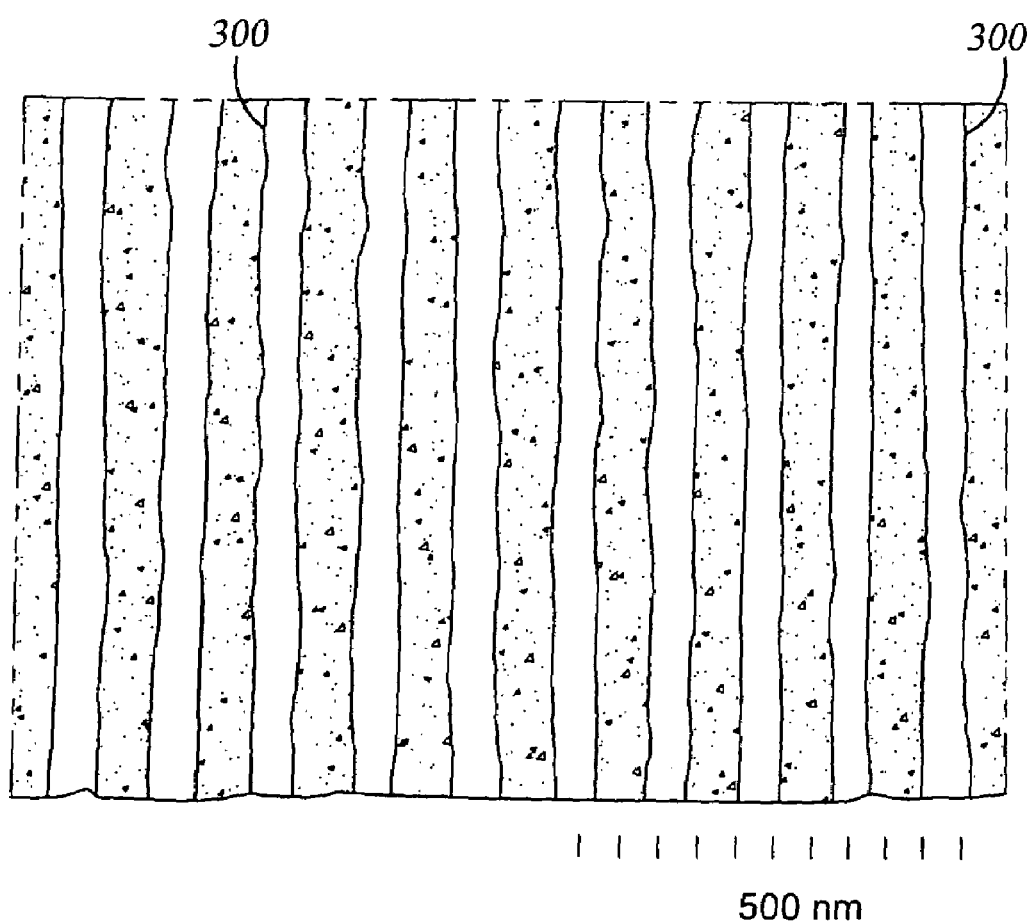
FIG. 3C shows a schematic top view of the etched silicon nitride layer 300 of FIG. 3A, which was traced from a photomicrograph.

FIGS. 3A-3C are drawings based on photomicrographs taken of a silicon nitride layer 300, etched in a lines and spaces pattern, where etching was performed using the etch chemistry and process conditions of Run # 8 (from Table Two, above). FIG. 3A shows a schematic cross-sectional front view of silicon nitride layer 300. The etched line exhibits a vertical sidewall profile, where the angle $\theta_3$ between the sidewall and a horizontal surface at the base of the sidewall ranges between about 88° and about 92°. FIG. 3B shows a schematic side view of the etched silicon nitride layer 300 of FIG. 3A. Note the reduction in striation, as compared to the sidewall shown in FIG. 2B. FIG. 3C shows a schematic top view of the etched silicon nitride layer 300 of FIG. 3A. The etched line shown in FIG. 3C exhibits a more uniform line width than the etched line of FIG. 2C.

When pattern etching a silicon nitride layer using the $CH_2F_2/CF_4/O_2$ etch chemistry disclosed in the '297 application in combination with a 193 nm photoresist which is based on alicyclic polymer resin technology, we found that the polymer generated on etched surfaces as a result of the combination of the $CH_2F_2$ etchant gas with species from the photoresist was very soft. The soft polymer produced distortions in the photoresist pattern profile during etching, inducing the non-uniform silicon nitride sidewall 210 shown in FIG. 2B, and evident from the top view shown in FIG. 2C. It is also possible that the photoresist itself is distorting during the silicon nitride etch process, due to the composition of the alicyclic polymer binders of the photoresist which are not able to pack as densely together as some other types of polymeric binder resins, such as those based on blocked polyhydroxystyrene with methacrylate (available from Shipley, Inc., Marlboro, Mass.), which have not demonstrated this deformation problem. Distortion of the photoresist during the etch process can result in the striation and non-uniformity of the silicon nitride sidewall seen in FIGS. 2B and 2C.

It is our conclusion that the use of the less hydrogen-rich, $CHF_3$ polymer-forming etchant gas in combination with the 193 nm photoresist based on alicyclic polymer resin technology resulted in the generation of a less porous or more dense polymer on the photoresist surface. Even at a reduced thickness, this polymer can sustain plasma etching evenly, and this was mirrored in the smooth, unstriated silicon nitride sidewall 300, illustrated in FIG. 3B, and evidenced in the top view shown in FIG. 3C. A smooth sidewall on the silicon nitride hard mask surface results in more uniform etch profiles of subsequently etched underlying layers.

In general, we found that decreasing the volumetric ratio of $CF_4$ to $CHF_3$ in the plasma source gas and increasing the process chamber pressure resulted in better selectivity for etching silicon nitride relative to photoresist, and less faceting of the photoresist. Advantageous results were achieved at volumetric ratios of $CF_4$ to $CHF_3$ within the range of about 1:1 to about 2:1, and at process chamber pressures within the range of about 20 mTorr to about 60 mTorr.

We also performed a series of experiments to examine etch uniformity across the surface of the substrate when the volumetric ratio of $CF_4$ to $CHF_3$ was varied. We measured the CD bias in dense and isolated feature areas of a silicon substrate wafer when the following etch chemistry and process conditions were used to pattern etch the silicon nitride layer: 300 sccm $CF_4$; 250 sccm $CHF_3$; 30 mTorr process chamber pressure; 500 W plasma source power; 100 W substrate bias power; and 60° C. substrate temperature. As used herein, the term "CD bias" refers to the difference between the line width of an etched line and the line width in the photoresist used to pattern the line. The term "dense feature area" refers to an area on the substrate where features are spaced closely together; the term "isolated feature area" refers to an area on the substrate where features are spaced relatively far apart.

Figure 5A:
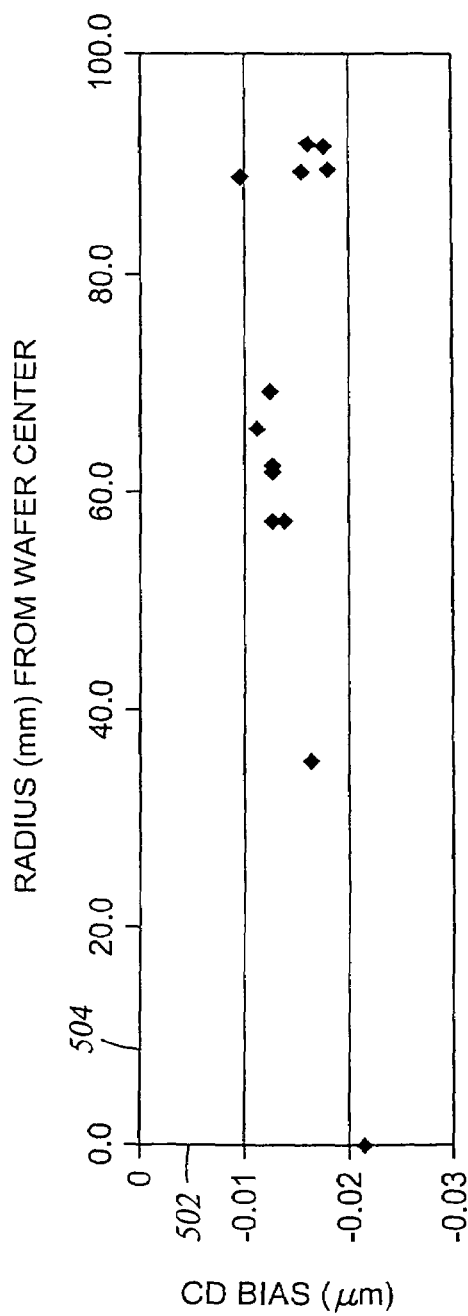
FIG. 5A is a graph 500 showing critical dimension (CD) bias 502 as a function of radius 504 of travel from wafer center in dense etched feature areas when a plasma source gas composition of 300 sccm $CF_4$ and 250 sccm $CHF_3$ was used to pattern etch a silicon nitride layer. The process chamber pressure was 30 mTorr.
Figure 5B:
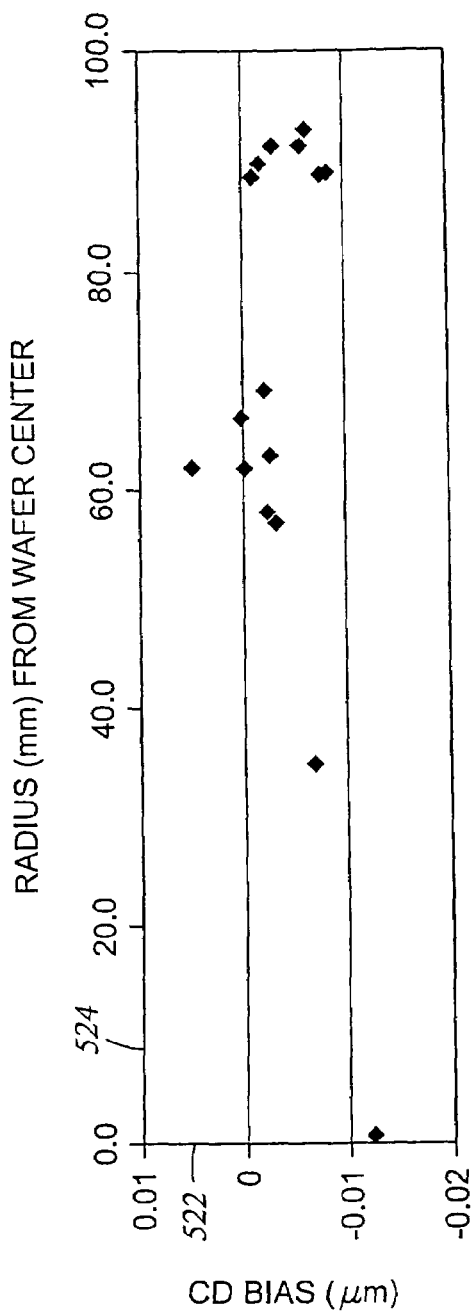
FIG. 5B is a graph 520 showing CD bias 522 as a function of radius 524 of travel from wafer center in isolated etched feature areas when a plasma source gas composition of 300 sccm $CF_4$ and 250 sccm $CHF_3$ was used to pattern etch a silicon nitride layer. The process chamber pressure was 30 mTorr.

FIG. 5A is a graph 500 showing CD bias 502 as a function of radius 504 from wafer center in dense feature areas of the substrate. As used herein, the term "radius" refers to the distance of travel from the center of a circular substrate wafer toward the edge of the wafer. FIG. 5B is a graph 520 showing CD bias 522 as a function of radius 524 from wafer center in isolated feature areas of the substrate. Referring to FIG. 5A, the average CD bias in dense feature areas was −0.0143 μm, with a range of 0.0114 μm. Referring to FIG. 5B, the average CD bias in isolated feature areas was −0.0033 μm, with a range of 0.0175 μm.

We also measured the CD bias in dense and isolated feature areas of a silicon substrate wafer when the following etch chemistry and process conditions were used to pattern etch the silicon nitride layer: 200 sccm $CF_4$; 130 sccm $CHF_3$; 45 mTorr process chamber pressure; 500 W plasma source power; 100 W substrate bias power; and 60° C. substrate temperature. FIG. 6A is a graph 600 showing CD bias 602 as a function of radius 604 from wafer center in dense feature areas of the substrate. FIG. 6B is a graph 620 showing CD bias 622 as a function of radius 624 from wafer center in isolated feature areas of the substrate. Referring to FIG. 6A, the average CD bias in dense feature areas was −0.0167 μm, with a range of 0.0131 μm. Referring to FIG. 6B, the average CD bias in isolated feature areas was −0.0045 μm, with a range of 0.0183 μm.

A comparison of the experimental results illustrated in FIGS. 5 and 6 indicates that slightly better etch uniformity was achieved with a lower volumetric ratio of $CF_4$ to $CHF_3$ (1.2:1 in FIG. 5 versus 1.5:1 in FIG. 6) and a lower process chamber pressure (30 mTorr in FIG. 5 versus 45 mTorr in FIG. 6).

Figure 7A:
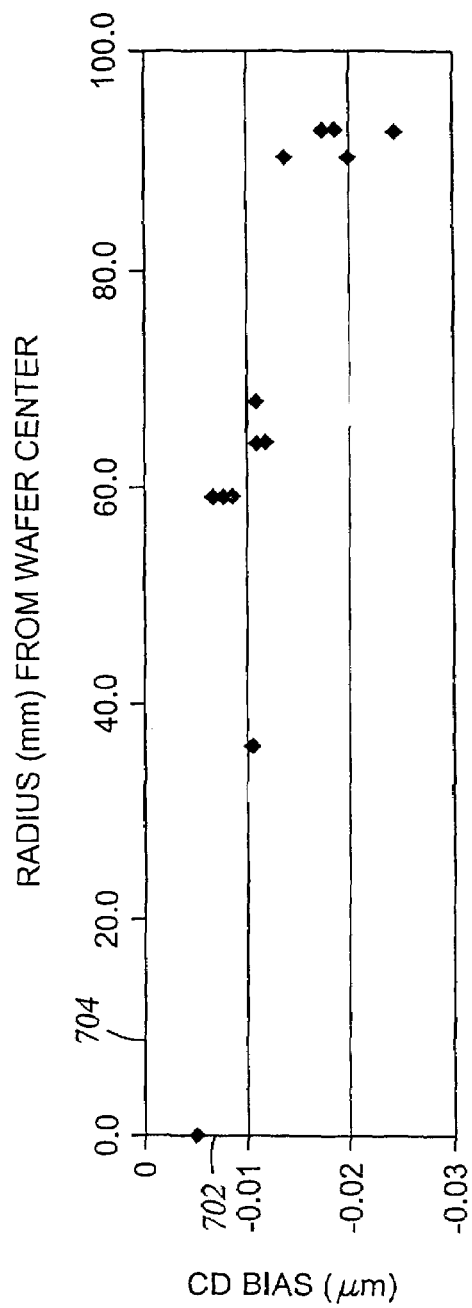
FIG. 7A is a graph 700 showing CD bias 702 as a function of radius 704 of travel from wafer center in dense etched feature areas when a plasma source gas composition of 200 sccm $CF_4$ and 110 sccm $CHF_3$ was used to pattern etch a silicon nitride layer. The process chamber pressure was 30 mTorr.
Figure 7B:
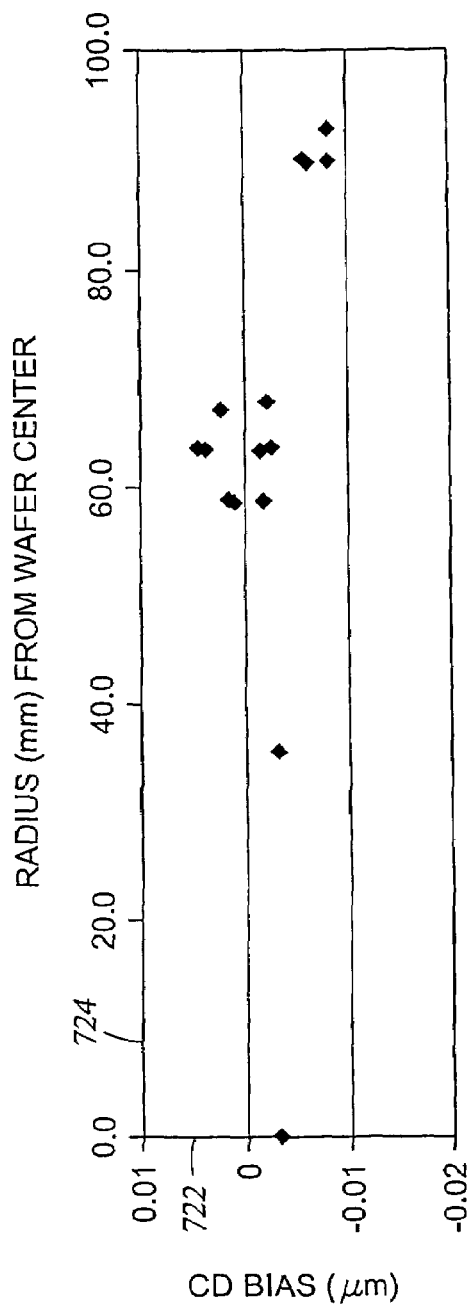
FIG. 7B is a graph 720 showing CD bias 722 as a function of radius 724 of travel from wafer center in dense etched feature areas when a plasma source gas composition of 255 sccm $CF_4$ and 185 sccm $CHF_3$ was used to pattern etch a silicon nitride layer. The process chamber pressure was 30 mTorr.
Figure 7C:
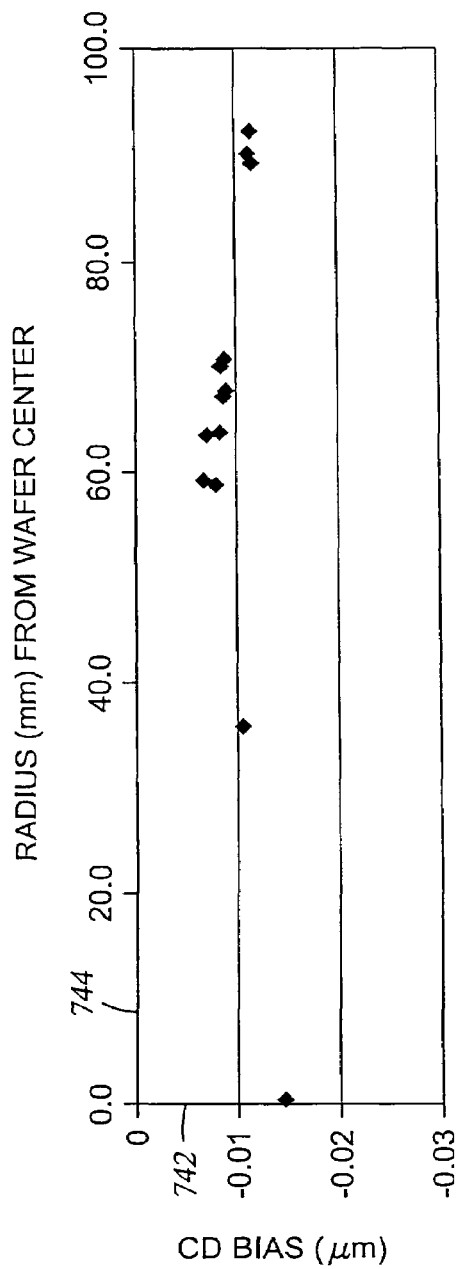
FIG. 7C is a graph 740 showing CD bias 742 as a function of radius 744 of travel from wafer center in dense etched feature areas when a plasma source gas composition of 280 sccm $CF_4$ and 217 sccm $CHF_3$ was used to pattern etch the silicon nitride layer. The process chamber pressure was 30 mTorr.
Figure 7D:
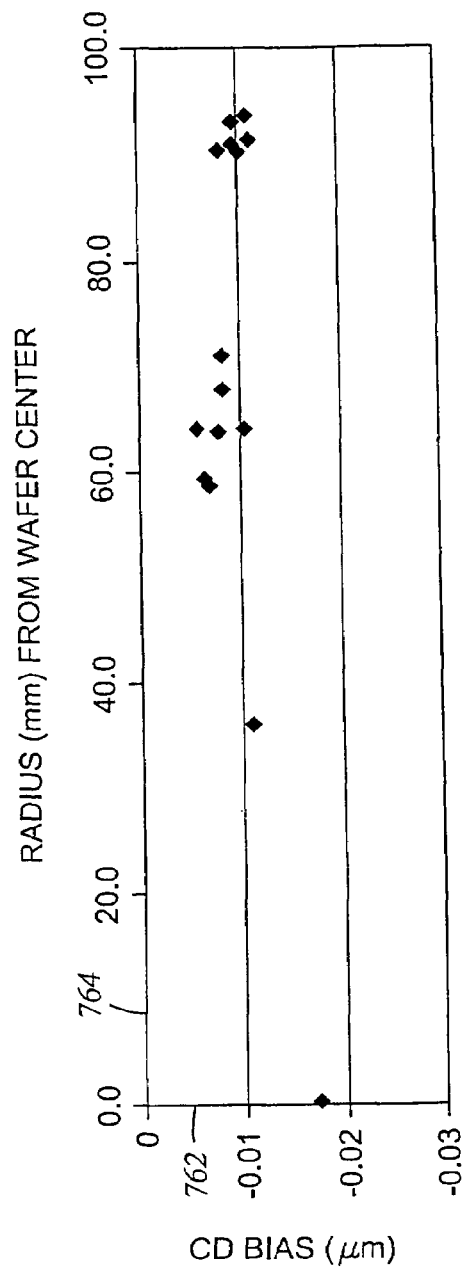
FIG. 7D is a graph 760 showing CD bias 762 as a function of radius 764 of travel from wafer center in dense etched feature areas when a plasma source gas composition of 300 sccm $CF_4$ and 250 sccm $CHF_3$ was used to pattern etch the silicon nitride layer. The process chamber pressure was 30 mTorr.

We performed another series of experiments to examine etch uniformity in dense feature areas of the substrate when the volumetric ratio of $CF_4$ to $CHF_3$ was varied. FIG. 7A is a graph 700 showing CD bias 702 as a function of radius 704 from wafer center in dense feature areas of the substrate when a plasma source gas composition of 200 sccm $CF_4$ and 110 sccm $CHF_3$ was used to pattern etch the silicon nitride layer. FIG. 7B is a graph 720 showing CD bias 722 as a function of radius 724 in dense feature areas of the substrate when a plasma source gas composition of 255 sccm $CF_4$ and 185 sccm $CHF_3$ was used to pattern etch the silicon nitride layer. FIG. 7C is a graph 740 showing CD bias 742 as a function of radius 744 from wafer center in dense feature areas of the substrate when a plasma source gas composition of 280 sccm $CF_4$ and 217 sccm $CHF_3$ was used to pattern etch the silicon nitride layer. FIG. 7D is a graph 760 showing CD bias 762 as a function of radius 764 in dense feature areas of the substrate when a plasma source gas composition of 300 sccm $CF_4$ and 250 sccm $CHF_3$ was used to pattern etch the silicon nitride layer. Other process conditions were held constant, as follows: 30 mTorr process chamber pressure; 500 W plasma source power; 100 W substrate bias power; and 60° C. substrate temperature.

Referring to FIG. 7A, the average CD bias in dense feature areas was −0.015 μm, with a range of 0.019 μm. Referring to FIG. 7B, the average CD bias in dense feature areas was −0.003 μm, with a range of 0.013 μm. Referring to FIG. 7C, the average CD bias in dense feature areas was −0.01 μm, with a range of 0.008 μm. Referring to FIG. 7D, the average CD bias in dense feature areas was −0.009 μm, with a range of 0.012 μm.

In general, the plasma source gas composition of 280 sccm $CF_4$ and 217 sccm $CHF_3$ (1.3:1 $CF_4$:$CHF_3$) provided the best CD uniformity (average CD bias −0.01 μm, with a range of 0.008 μm), as shown in FIG. 7C.

During etching, etch process byproducts build up on etched feature surfaces. The amount of etch byproduct build-up typically varies from one area of the substrate wafer to another (for example, from the center to the edge of the wafer). The longer the residence time of etch gases and etch process byproducts within the plasma processing region 412 of the etch chamber 400 (shown in FIG. 4A), the greater the amount of etch byproduct build-up. If the residence time is too long, etch byproducts may build up disproportionately on certain areas of the wafer, thereby affecting CD uniformity. The residence time of etch gases and etch byproducts within the plasma processing region can be decreased by increasing the total flow rate of gases into the chamber, and increasing the pumping rate for removal of gases from the chamber. Decreasing the residence time can prevent excessive etch byproduct build-up product in certain areas of the wafer, providing a more uniform CD distribution.

An important parameter for the $CF_4$/$CHF_3$ etch process is the total flow of fluorine-containing species into the processing chamber. We found that increasing the total gas flow to the chamber while maintaining a fixed ratio of $CF_4$ to $CHF_3$ results in an undercut etch profile (i.e., an etch profile angle greater than about 92°). Therefore, in order to obtain a vertical profile, the relative amount of $CHF_3$ in the plasma source gas needs to be increased (i.e., the volumetric ratio of $CF_4$ to $CHF_3$ in the plasma source gas should be decreased) as the total gas flow is increased. As a result of increasing the relative amount of $CHF_3$ in the plasma source gas, the selectivity for etching silicon nitride relative to the photoresist increases, due to the increased presence of passivating species in the plasma.

Figure 8:
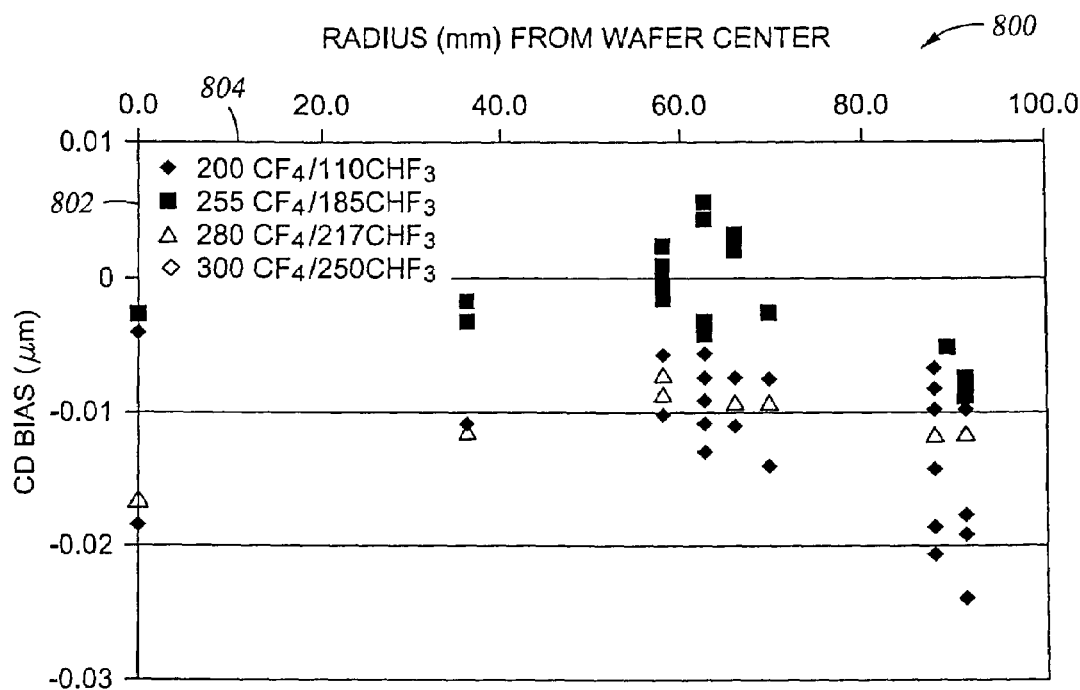
FIG. 8 is a graph 800 showing CD bias 802 as a function of radius 804 of travel from wafer center for various volumetric ratios of $CF_4$:$CHF_3$ in the plasma source gas used to pattern etch the silicon nitride layer. The process chamber pressure was 30 mTorr. The etched feature critical dimension was 0.13 μm.

FIG. 8 is a graph 800 showing CD bias 802 as a function of radius 804 from wafer center for various volumetric ratios of $CF_4$:$CHF_3$ in the plasma source gas used to etch the silicon nitride layer. As the total gas flow to the chamber increases, at a constant chamber pressure, the CD bias distribution changes from more CD loss at the edge of the substrate wafer to more CD loss at the center of the substrate wafer. This is consistent with etch rate data, which show a higher etch rate at the wafer center at high total gas flow rates. Referring again to FIG. 8, the most advantageous condition for CD bias uniformity was obtained using a plasma source gas composition comprising 280 sccm $CF_4$ and 217 sccm $CHF_3$.

As illustrated in FIG. 8, as the volumetric ratio of $CF_4$:$CHF_3$ in the plasma source gas varies, the CD bias distribution across the substrate wafer changes. As a result, each particular plasma source gas composition has its own "signature" CD bias distribution. It is therefore possible to tune the CD uniformity across the substrate wafer by selecting a plasma source gas composition having a particular signature which compensates for CD non-uniformities of etch processes subsequently performed on underlying layers within the semiconductor structure.

Figure 9:
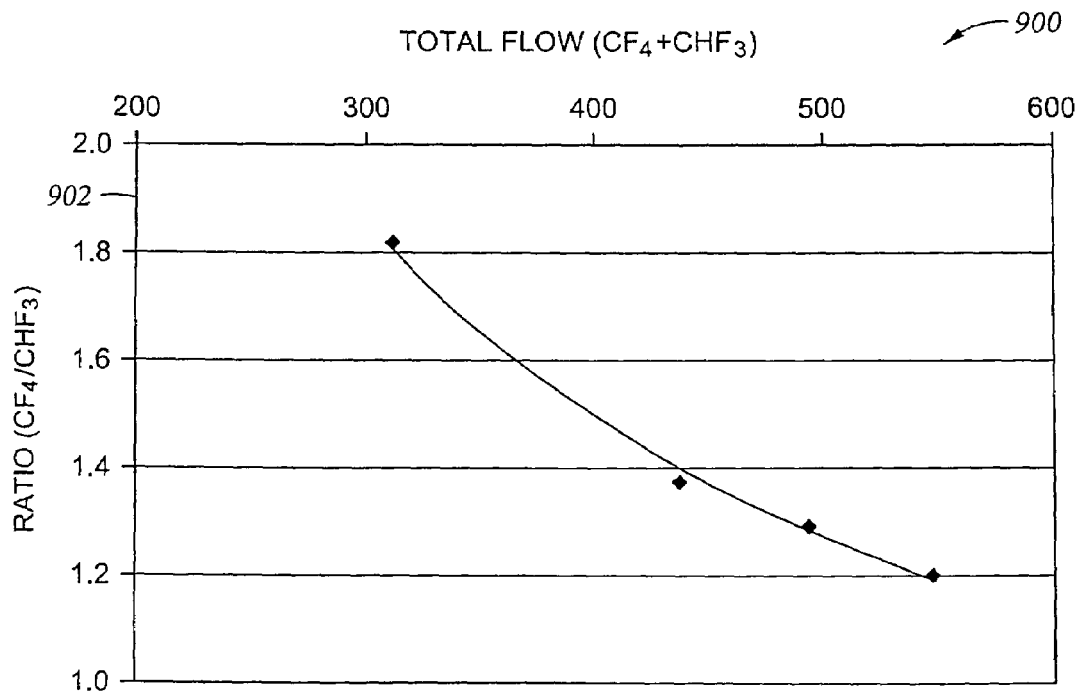
FIG. 9 is a graph 900 showing advantageous volumetric ratios 902 of $CF_4$:$CHF_3$ versus the total gas flow ($CF_4$+$CHF_3$) 904 to the process chamber, when an Applied Materials' DPS II etch chamber is used to perform silicon nitride etching.

FIG. 9 is a graph 900 showing advantageous volumetric ratios 902 of $CF_4$:$CHF_3$ versus the total gas flow ($CF_4$+$CHF_3$) 904 to the chamber, when an Applied Materials' DPS II etch chamber is used to perform silicon nitride etching.

According to the present method embodiment, etching of a silicon-containing dielectric material is typically performed using a plasma generated from a source gas which includes about 50 to about 75 volume % $CF_4$, and about 25 to about 50 volume % $CHF_3$. Often, the plasma source gas is selected to include about 50 to about 65 volume % $CF_4$, and about 35 to about 50 volume % $CHF_3$.

If necessary to decrease the amount of passivation (for example, if there is too much $CHF_3$ in the plasma source gas), the plasma source gas composition may optionally include a nonreactive diluent gas such as helium, argon, neon, xenon, or krypton. Most typically, the nonreactive diluent gas is helium. The use of argon is less preferred, because it can lead to deformation of the photoresist, which will subsequently affect the etch profile of underlying layers within the semiconductor structure.

The etch method is typically performed in a semiconductor processing chamber having a decoupled plasma source. Typical process conditions for etching of a silicon-containing dielectric material, according to the present method embodiment, are provided in Table Three, below:

TABLE THREE

Typical Process Conditions for Etching
of a Silicon-Containing Dielectric Material

| Process Parameter | Range of Process Conditions | Typical Process Conditions | Advantageous Known Process Conditions |
|---|---|---|---|
| $CF_4$ Flow Rate (sccm) | 50-600 | 100-300 | 200-300 |
| $CHF_3$ Flow Rate (sccm) | 30-600 | 30-300 | 100-300 |
| He Flow Rate (sccm) | 0-500 | 0-100 | 0-100 |
| Total Gas Flow (sccm) | 100-1000 | 130-600 | 300-600 |
| Ave. Residence Time (sec) | 1-10 | 1-6 | 2-6 |
| Process Chamber Pressure (mTorr) | 2-200 | 4-60 | 20-60 |
| Plasma Source Power (W) | 200-1200 | 300-800 | 300-800 |
| Substrate Bias Power (W) | 0-1500 | 50-200 | 50-200 |
| Plasma Density (e/cm$^3$) | $1 \times 10^{10}$-$1 \times 10^{13}$ | $1 \times 10^{10}$-$1 \times 10^{13}$ | $1 \times 10^{10}$-$1 \times 10^{13}$ |
| Substrate Temperature (° C.) | 10-80 | 20-60 | 20-60 |
| Etch Time Period (seconds) | 10-100 | 40-100 | 40-100 |

We have discovered that a volumetric ratio of $CF_4$ to $CHF_3$ in the plasma source gas within the range of about 2:3 to about 3:1 provides both a smooth etched sidewall surface (having a surface roughness of less than 5 nm), a vertical etch profile (exhibiting an angle ranging from about 88° to about 92°), and good (about 1.5:1 or better) selectivity for etching the silicon-containing dielectric layer relative to an overlying photoresist. Typically, the volumetric ratio of $CF_4$ to $CHF_3$ in the plasma source gas is within the range of about 1:1 to about 2:1.

The present method is particularly useful in the pattern etching of a silicon-containing dielectric layer which is to be subsequently used as a hard mask for pattern etching of semiconductor device features having a feature size of about 0.15 μm or less; more typically, about 0.1 μm or less. The method provides a selectivity for etching a silicon-containing dielectric layer relative to such a photoresist of about 1.5:1 or better. The method also provides an etch profile sidewall angle ranging from 88° to 92° between the etched silicon-containing dielectric layer and an underlying horizontal layer in the semiconductor structure. In addition, the method reduces etched sidewall roughness to about 5 nm or less.

Although the Examples above are described with reference to the use of a silicon-containing dielectric material as a hard mask in the etching of a gate structure, the etch chemistry and processing conditions described above can be used any time a silicon-containing dielectric material is used as a masking layer, for example, in the etching of a shallow trench or other semiconductor feature.

Although the Examples above are described with reference to the use of an ArF photoresist for sub-150 nm devices which is based on alicyclic polymer resin technology, the method of the invention is expected to solve problems with patterned photoresist deformation during etching for photoresists imagable within the range of about 100 nm to about 200 nm. In particular, the present method is expected to work especially well in solving this problem for photoresists in general which are based on alicyclic polymer resin (or similar) technology.

The above described exemplary embodiments are not intended to limit the scope of the present invention, as one skilled in the art can, in view of the present disclosure expand such embodiments to correspond with the subject matter of the invention claimed below.

We claim:

1. A method of pattern etching a layer of a silicon-containing dielectric material to form a hard mask, wherein a patterned photoresist layer used during etching of said hard mask is one which is sensitive to radiation exhibiting a wavelength within the range of about 100 nm to about 200 nm, whereby feature sizes of about 0.15 μm or smaller are created in said patterned photoresist and in said hard mask, wherein said pattern etching of said silicon-containing dielectric layer is accomplished using a plasma generated from a source gas, wherein chemically reactive etchant gases within said source gas consist essentially of $CF_4$ and $CHF_3$, and wherein a volumetric ratio of $CF_4$ to $CHF_3$ is within a range of about 2:3 to about 3:1, whereby sidewalls of a pattern etched in said silicon-containing dielectric layer exhibit a surface roughness of less than about 5 nm.

2. The method of claim 1, wherein said silicon-containing dielectric material is selected from the group consisting of silicon nitride, silicon oxide, silicon oxynitride, and combinations thereof.

3. The method of claim 1, wherein a volumetric ratio of $CF_4$ to $CH_3$ is within the range of about 1:1 to about 2:1.

4. The method of claim 1, wherein said plasma source gas composition comprises about 50 to about 75 volume % $CF_4$, and about 25 to about 50 volume % $CHF_3$.

5. The method of claim 4, wherein said plasma source gas composition comprises about 50 to about 65 volume % $CF_4$, and about 35 to about 50 volume % $CHF_3$.

6. The method of claim 1, wherein said photoresist is sensitive to 193 nm radiation.

7. The method of claim 1, wherein said photoresist is based on alicyclic polymer resin technology.

8. The method of claim 1, wherein said silicon-containing dielectric layer is used as a hard mask during pattern etching of an underlying semiconductor structure, wherein said semiconductor structure includes features having a feature size of about 0.15 μm or less.

9. The method of claim 1, wherein said silicon-containing dielectric layer has a thickness within the range of about 1000 Å to about 2500 Å, prior to etching of said pattern.

10. The method of claim 1, wherein etching is performed at a process chamber pressure within the range of about 4 mTorr to about 60 mTorr.

11. The method of claim 10, wherein etching is performed at a process chamber pressure within the range of about 20 mTorr to about 60 mTorr.

12. The method of claim 1, wherein said method is performed in a semiconductor processing chamber having a decoupled plasma source.

13. The method of claim 1, wherein said method provides a selectivity for etching said silicon-containing dielectric layer relative to said photoresist of at least 1.5:1.

14. The method of claim 1, wherein said method provides an etch profile sidewall angle ranging from 88° to 92° between said etched silicon-containing dielectric layer and an underlying horizontal layer.

15. The method of claim 1, wherein the chemically etchant species within said plasma consist essentially of fluorine species.

16. The method of claim 1, wherein said source gas further comprises a nonreactive diluent gas selected from the group consisting of helium, argon, neon, xenon, and krypton.

17. The method of claim 16, wherein said nonreactive diluent gas is helium.

18. A method of pattern etching a layer of silicon nitride to form a hard mask, wherein a patterned photoresist layer used during etching of said hard mask is one which is sensitive to radiation exhibiting a wavelength within the range of about 100 nm to about 200 nm, whereby feature sizes of about 0.15 µm or smaller are created in said photoresist and in said silicon nitride hard mask, wherein said pattern etching of said silicon nitride layer is accomplished using a plasma generated from a source gas, wherein chemically reactive etchant gases within said source gas consist essentially of $CF_4$ and $CHF_3$, and wherein a volumetric ratio of $CF_4$ to $CHF_3$ is within a range of about 2:3 to about 3:1, whereby sidewalls of a pattern etched in said silicon-containing dielectric layer exhibit a surface roughness of less than about 5 nm.

19. The method of claim 18, wherein a volumetric ratio of $CF_4$ to $CHF_3$ is within the range of about 1:1 to about 2:1.

20. The method of claim 18, wherein said plasma source gas composition comprises about 50 to about 75 volume % $CF_4$, and about 25 to about 50 volume % $CHF_3$.

21. The method of claim 20, wherein said plasma source gas composition comprises about 50 to about 65 volume % $CF_4$, and about 35 to about 50 volume % $CHF_3$.

22. The method of claim 18 wherein said photoresist is sensitive to 193 nm radiation.

23. The method of claim 18, wherein said photoresist is based on alicyclic polymer resin technology.

24. The method of claim 18, wherein said silicon nitride layer is used as a hard mask during pattern etching of an underlying semiconductor structure, wherein said semiconductor structure includes features having a feature size of about 0.15 µm or less.

25. The method of claim 18, wherein said silicon nitride layer has a thickness within the range of about 1000 Å to about 2500 Å, prior to etching.

26. The method of claim 18, wherein etching is performed at a process chamber pressure within the range of about 4 mTorr to about 60 mTorr.

27. The method of claim 26, wherein etching is performed at a process chamber pressure within the range of about 20 mTorr to about 60 mTorr.

28. The method of claim 18 wherein said method is performed in a semiconductor processing chamber having a decoupled plasma source.

29. The method of claim 18, wherein said method provides a selectivity for etching said silicon nitride layer relative to said photoresist of at least 1.5:1.

30. The method of claim 18, wherein said method provides an etch profile sidewall angle ranging from 88° to 92° between said etched silicon nitride layer and an underlying horizontal layer.

31. The method of claim 18, wherein the chemically etchant species within said plasma consist essentially of fluorine species.

32. The method of claim 18, wherein said source gas further comprises a nonreactive diluent gas selected from the group consisting of helium, argon, neon, xenon, and krypton.

33. The method of claim 32, wherein said nonreactive diluent gas is helium.

* * * * *